United States Patent [19]
Chan et al.

[11] Patent Number: 5,869,388
[45] Date of Patent: *Feb. 9, 1999

[54] METHOD OF GETTERING USING DOPED SOG AND A PLANARIZATION TECHNIQUE

[75] Inventors: Tsiu Chiu Chan, Carrollton; Frank Randolph Bryant, Denton, both of Tex.

[73] Assignee: STMicroelectronics, Inc., Carrollton, Tex.

[*] Notice: This patent issued on a continued prosecution application filed under 37 CFR 1.53(d), and is subject to the twenty year patent term provisions of 35 U.S.C. 154(a)(2).

[21] Appl. No.: 407,767

[22] Filed: Mar. 21, 1995

Related U.S. Application Data

[62] Division of Ser. No. 357,082, Dec. 15, 1994.

[51] Int. Cl.⁶ .................................................. H01L 21/322
[52] U.S. Cl. ........................ 438/476; 438/143; 438/760; 438/763; 438/782; 438/787
[58] Field of Search ............................. 437/11; 438/143, 438/476, 760, 763, 782, 787

[56] References Cited

U.S. PATENT DOCUMENTS

| | | | |
|---|---|---|---|
| 4,828,629 | 5/1989 | Ikeda et al. | 257/904 |
| 4,920,072 | 4/1990 | Keller et al. | 257/763 |
| 5,424,570 | 6/1995 | Sardella et al. | 257/333 |

FOREIGN PATENT DOCUMENTS 57-0007939  1/1982  Japan ......................................... 437/41

OTHER PUBLICATIONS

Allied Signal Technologies Product Bulletin, "Accuglass P–XXY A Series Phosphosilicate Spin–On Glasses".
Allied Signal Technologies Product Bulletin; "Accuglass P–XXY A Series Phosphosilicate Spin–On Glasses"; Nov. 1988.
Allied Signal Technologies Product Bulletin; "Accuglass P–TTY A Series Phosphosilicate Spin–On Glasses"; May 1992.

*Primary Examiner*—John F. Niebling
*Assistant Examiner*—Lynne A. Gurley
*Attorney, Agent, or Firm*—Theodore E. Galanthay; Lisa K. Jorgenson; Christopher F. Regan

[57] ABSTRACT

A method is provided for a planar surface of a semiconductor integrated circuit, and an integrated circuit formed according to the same. A gate electrode is formed over a substrate having source/drain regions adjacent to the gate electrode and in the substrate. A silicon dioxide layer is formed over the gate electrode and a portion of the substrate not covered by the gate electrode. A first phosphorous doped spin-on-glass layer is formed over the silicon dioxide layer, wherein the spin-on-glass is doped to a concentration sufficient to facilitate gettering of charge mobile ions. An opening is then formed in the spin-on-glass layer and the silicon dioxide layer exposing a portion of the source drain region.

13 Claims, 1 Drawing Sheet

METHOD OF GETTERING USING DOPED SOG AND A PLANARIZATION TECHNIQUE

This is a Division of application Ser. No. 08/357,082, filed Dec. 15, 1994.

FIELD OF THE INVENTION

The present invention relates generally to semiconductor integrated circuit processing, and more specifically to a planarization technique suitable for use in the submicron technology.

BACKGROUND OF THE INVENTION

The manufacturing costs of integrated circuits are largely dependent upon the chip area required to implement desired functions. The chip area, in turn, is defined by the geometries and sizes of the active components such as gate electrodes in metal-oxide-semiconductor (MOS) technology, and diffused regions such as MOS source and drain regions and bipolar emitters and base regions. These geometries and sizes are often dependent upon the photolithographic resolution available for the particular manufacturing facility. The goal of photolithography in establishing the horizontal dimensions of the various devices and circuits is to create a pattern which meets design requirements as well as to correctly align the circuit pattern on the surface of the wafer. As line widths shrink smaller and smaller in submicron photolithography, the process to print lines and contact holes in photoresist becomes increasingly more difficult.

With circuit advancement to the very-large-scale integration (VLSI) levels, more and more layers are added to the surface of the wafer. These additional layers in turn create more steps on the wafer surface. The resolution of small image sizes in photolithography thus becomes more difficult over the additional steps due to light reflection and the thinning of the photoresists over the steps. Planarization techniques are generally incorporated to offset the effects of a varied topography.

Many different planarization techniques have been used in the past, each with its own disadvantages. Multilayer photoresist processes have been used to create the desired images. The particular photoresist process depends upon the severity of the topography and the size of the desired images. These processes however, take longer and require more yield-limiting steps. Polyimides and reflow glass layers are used to planarize the surface of the wafer. Polyimides can be spun onto the wafer like the photoresist materials. After application, the polyimide is covered with a hard layer and patterned like the photoresists. Reflow glass layers are generally doped with boron or phosphorous or both to lower the temperature at which the glass layer will flow. While these layers achieve more planarization than previous methods, additional planarization is still required as the device geometries continue to shrink.

Spin-on-glass (SOG) is also a hard planarizing layer which is a mixture of silicon dioxide in a solvent that quickly evaporates. There may be carbon in the SOG to reduce the SOG's susceptibility to cracking after it is baked. SOG, by itself, however, is unable to prevent mobile ionic contaminants from travelling through the layer and into the devices or wafer surface below the SOG.

It is therefore an object of this invention to provide a method of forming a planarizing layer which is capable of preventing mobile ionic contaminants from traveling through the planarizing layer and into the underlying layers.

It is a further object of this invention to provide such a method which utilizes a doped spin-on-glass insulating layer.

It is a further object of this invention to provide such a method which utilizes conventional process flows.

Other objects and advantages of the invention will be apparent to those of ordinary skill in the art having reference to the following specification together with the drawings.

SUMMARY OF THE INVENTION

The invention may be incorporated into a method for forming a semiconductor device structure, and the semiconductor device structure formed thereby. A conductive structure is formed on the integrated circuit such as a gate electrode having source/drain regions in the substrate. An insulating layer, such as silicon dioxide, is formed over the conductive structure and a portion of the integrated circuit not covered by the conductive structure. A planar doped spin-on-glass layer is then formed over the insulating layer, wherein the spin-on-glass is doped to a concentration sufficient to prevent gettering of charge mobile ions.

BRIEF DESCRIPTION OF THE DRAWINGS

The novel features believed characteristic of the invention are set forth in the appended claims. The invention itself, however, as well as a preferred mode of use. and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
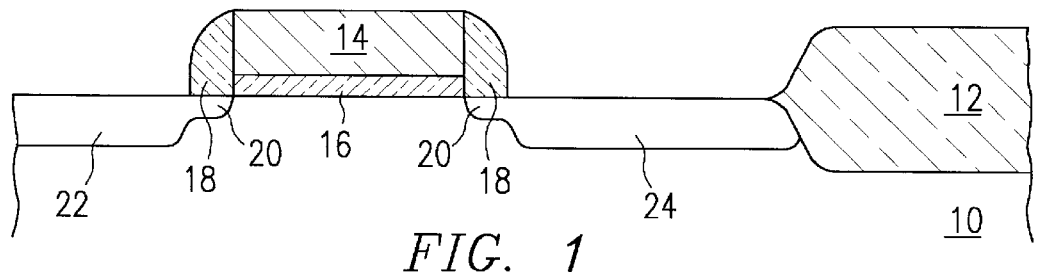
FIGS. 1–2 are cross sectional views of the fabrication of a semiconductor integrated circuit according to the present invention.

Referring to FIG. 1, an integrated circuit is to be formed on a silicon substrate 10. A field oxide region 12 is formed in an area on the substrate as known in the art to separate active areas. A conductive structure such as a transistor is formed over a portion of the substrate 10. The transistor comprises gate electrode 14, preferably a doped polysilicon, which is formed over a gate oxide 16 as known in the art. The transistor typically also comprises oxide spacers 18 formed adjacent to the gate oxide 16 and gate electrode 14. Lightly doped source and drain regions 20 and heavily doped source and drain regions 22, 24 are formed in the substrate adjacent to the gate electrode, also by conventional methods.

Figure 2:
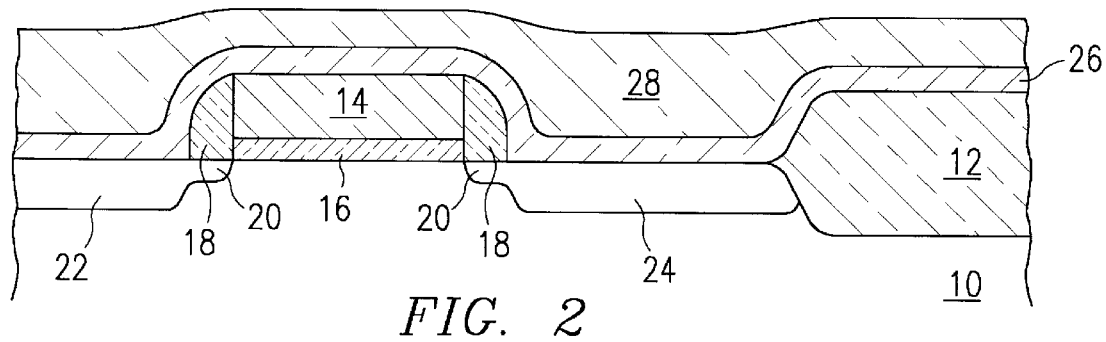

Referring to FIG. 2, an insulating layer 26, such as silicon dioxide is formed over a portion of the integrated circuit including the conductive structure. The silicon dioxide layer 26 is formed to prevent counterdoping between, for example, the source/drain regions 22, 24 and overlying layers subsequently formed. Layer 26 typically has a thickness of between approximately 100 to 2000 angstroms. Layer 26 may also be lightly doped to improve its protective and flow characteristics.

A planar spin-on-glass layer 28 is then deposited over the insulating layer 26 to a depth of between approximately 2000 to 8000 angstroms. The difference between the prior art and the present invention is that the SOG is now doped in the present invention, preferably with phosphorous, to a concentration sufficient to allow gettering of charge mobile ions. The dopant concentration is preferably between approximately 4 to 7 percent. For example, sodium molecules will not move through the SOG and penetrate the silicon dioxide layer 26 and silicon substrate 10. Instead, the contaminating ions will attach to the phosphorous in the SOG and be prevented from changing device characteristics. The SOG layer 28 may be cured to increase the layer's protective characteristics. The SOG is preferably cured at or below atmospheric pressure to enhance solvent outgassing. In addition, the temperature at which the SOG is cured will ramped up to between approximately 500° to 800 C. For example, the temperature may begin at a lower temperature to drive out the solvent molecules and be increased to a higher temperature to densify the SOG. The doped SOG thus will planarize the surface of the wafer before a contact opening is formed while preventing contaminating ions from moving through the layer. The doped SOG will be particularly useful in the submicron regime where device size is decreasing and device performance is critical.

Alternatively, an etchback of the SOG layer 28 may be done before or after the curing process. A second layer of SOG may be formed to further planarize the surface of the wafer. The second layer, if formed, may also be doped and cured. Other uses of the doped SOG layer will become apparent to those skilled in the art. For example, the doped SOG layer may be formed between different polysilicon layers. Again, the doped SOG will planarize the surface of the wafer and allow gettering of the charge mobile ions.

While the invention has been particularly shown and described with reference to a preferred embodiment, it will be understood by those skilled in the art that various changes in form and detail may be made therein without departing from the spirit and scope of the invention.

What is claimed is:

1. A method of forming a planar surface on a partially fabricated semiconductor integrated circuit structure comprising the steps of:

forming a conductive structure on the integrated circuit structure;

forming an insulating silicon dioxide layer directly on the conductive structure and a portion of the integrated circuit structure not covered by the conductive structure;

forming a planarizing layer directly on the insulating silicon dioxide layer by applying a planar doped spin-on-glass layer having a thickness of between about 2,000 to 6,000 angstroms directly on the silicon dioxide insulating layer, wherein said planar doped spin-on-glass is doped to a concentration of between about 4 to 7 percent dopant sufficient to facilitate gettering of charged mobile ions;

curing the doped spin-on-glass layer during a ramp up in temperature between about 500° and 800° C.; and forming an opening in said spin-on-glass layer and said silicon dioxide layer exposing a portion of said conductive structure.

2. The method of claim 1, wherein said conductive structure comprises a transistor gate having a gate electrode and source/drain regions in the substrate adjacent to the gate electrode.

3. The method of claim 1, wherein the insulating layer comprises silicon dioxide.

4. The method of claim 3, wherein said planar doped spin-on-glass layer is doped with phosphorous.

5. The method of claim 1, wherein the insulating layer has a thickness of between approximately 100 to 2000 angstroms.

6. The method of claim 1, wherein said planar doped spin-on-glass layer is doped with phosphorous to a concentration of between 4 to 7 percent.

7. The method of claim 1, wherein said planar doped spin-on-glass layer is cured after it is formed.

8. The method of claim 7, wherein said planar doped spin-on-glass layer is cured at or below atmospheric pressure to enhance solvent outgassing.

9. The method of claim 1, further comprising the steps of:

performing a partial etchback of said first planar doped spin-on-glass layer; and forming a second planar doped spin-on-glass layer over said first planar doped spin-on-glass layer, wherein said second spin-on-glass is doped to a concentration sufficient to facilitate gettering of charge mobile ions.

10. The method of claim 9, wherein said second planar doped spin-on-glass layer is cured.

11. A method of forming a planar surface on a semiconductor integrated circuit; comprising the steps of:

forming source/drain regions in a substrate and forming a gate electrode over said substrate in a region adjacent to said source/drain regions;

forming an insulating silicon dioxide layer directly on said gate electrode and a portion of said substrate not covered by said gate electrode;

forming a planarizing layer directly on the insulating silicon dioxide layer by applying a planar, phosphorous doped spin-on-glass layer having a thickness of between about 2,000 to 6,000 angstroms directly on said silicon dioxide layer, wherein said spin-on-glass is doped with a concentration of between about 4 to 7 percent of dopant sufficient to facilitate gettering of charged mobile ions;

curing the doped spin-on-glass layer during a ramp up in temperature between about 500° and 800° C.; and forming an opening in said spin-on-glass layer and said silicon dioxide layer exposing a portion of said source/drain regions.

12. The method of claim 11, wherein said silicon dioxide layer is doped with phosphorous.

13. The method of claim 11, further comprising the steps of:

performing a partial etchback of said spin-on-glass layer applied on the insulating silicon dioxide layer; and forming a second planar, phosphorous doped spin-on-glass layer over said spin-on-glass layer that has been applied on the insulating silicon dioxide layer, wherein said second spin-on-glass is doped to a concentration sufficient to facilitate gettering of charge mobile ions.

* * * * *